United States Patent
Hu et al.

(10) Patent No.: US 11,791,527 B2
(45) Date of Patent: *Oct. 17, 2023

(54) PRINTED CIRCUIT BOARDS AND METHODS FOR MANUFACTURING THEREOF FOR RF CONNECTIVITY BETWEEN ELECTRO-OPTIC PHASE MODULATOR AND DIGITAL SIGNAL PROCESSOR

(71) Applicant: Ciena Corporation, Hanover, MD (US)

(72) Inventors: Kaisheng Hu, Kanata (CA); Georges-Andre Chaudron, Gatineau (CA); John David Wice, Kanata (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/568,234

(22) Filed: Jan. 4, 2022

(65) Prior Publication Data

US 2022/0181761 A1  Jun. 9, 2022

Related U.S. Application Data

(63) Continuation of application No. 16/890,057, filed on Jun. 2, 2020, now Pat. No. 11,217,869, which is a continuation of application No. 16/022,792, filed on Jun. 29, 2018, now Pat. No. 10,693,207.

(51) Int. Cl.
| | |
|---|---|
| *H01P 3/08* | (2006.01) |
| *G02B 6/42* | (2006.01) |
| *H01R 12/70* | (2011.01) |
| *H05K 1/11* | (2006.01) |
| *H05K 1/18* | (2006.01) |

(52) U.S. Cl.
CPC ............ *H01P 3/082* (2013.01); *G02B 6/4279* (2013.01); *G02B 6/4284* (2013.01); *H01R 12/7076* (2013.01); *H05K 1/115* (2013.01); *H05K 1/181* (2013.01)

(58) Field of Classification Search
CPC ....... G02B 6/42; G02B 6/4279; G02B 6/4284
See application file for complete search history.

(56) References Cited

U.S. PATENT DOCUMENTS

| | | | |
|---|---|---|---|
| 8,988,299 B2 | 3/2015 | Kam et al. | |
| 9,972,589 B1 | 5/2018 | Goh et al. | |
| 10,340,233 B1* | 7/2019 | Saiz ...................... | H05K 1/025 |
| 11,217,869 B2* | 1/2022 | Hu ......................... | H05K 1/115 |
| 2015/0205041 A1 | 7/2015 | Neelakantan et al. | |
| 2016/0025944 A1 | 1/2016 | Chen et al. | |
| 2016/0066423 A1 | 3/2016 | Sakamoto et al. | |
| 2016/0268213 A1 | 9/2016 | Jiang et al. | |
| 2017/0365563 A1 | 12/2017 | Chen et al. | |
| 2018/0269251 A1 | 9/2018 | Chang et al. | |
| 2020/0006836 A1 | 1/2020 | Hu et al. | |

* cited by examiner

*Primary Examiner* — Tina M Wong
(74) *Attorney, Agent, or Firm* — Baratta Law PLLC; Lawrence A. Baratta, Jr.

(57) ABSTRACT

A Printed Circuit Board (PCB) and methods for manufacturing the PCB board are provided. The PCB includes a Radio Frequency (RF) signal transition at a RF signal pad. Multiple conductive layers other than a conductive signal layer of the PCB and conductive portions of the conductive signal layer not in electrical contact with a RF signal transmission trace have common ground connections forming a ground cage structure within the PCB around the RF signal pad and RF the signal transmission trace.

19 Claims, 13 Drawing Sheets

PRINTED CIRCUIT BOARDS AND METHODS FOR MANUFACTURING THEREOF FOR RF CONNECTIVITY BETWEEN ELECTRO-OPTIC PHASE MODULATOR AND DIGITAL SIGNAL PROCESSOR

CROSS-REFERENCE TO RELATED APPLICATION(S)

This invention is a continuation of U.S. patent application Ser. No. 16/890,057, filed Jun. 2, 2021, which is now U.S. Pat. No. 11,217,869 with an issue date of Jan. 4, 2022, and which is also a continuation of U.S. patent application Ser. No. 16/022,792, filed Jun. 29, 2018, which is now U.S. Pat. No. 10,693,207, with an issue date of Jun. 23, 2021, the contents of each are incorporated by reference in their entirety.

TECHNICAL FIELD

This invention relates to high speed telecommunications, and in particular to printed circuit board mounting of connectors operating at radio frequencies, components and systems operating at radio frequencies and printed circuit board manufacture for operation at radio frequencies.

BACKGROUND

Electrical signals modulated at Radio Frequencies (RF), for example at or below 50 GHz, are employed to provide high speed telecommunications at high data rates. Discontinuities in electrical conductors conveying RF signals are prone to excite different signal resonance modes, especially in a millimeter waveband.

Figures 1A, 1B, 1C:
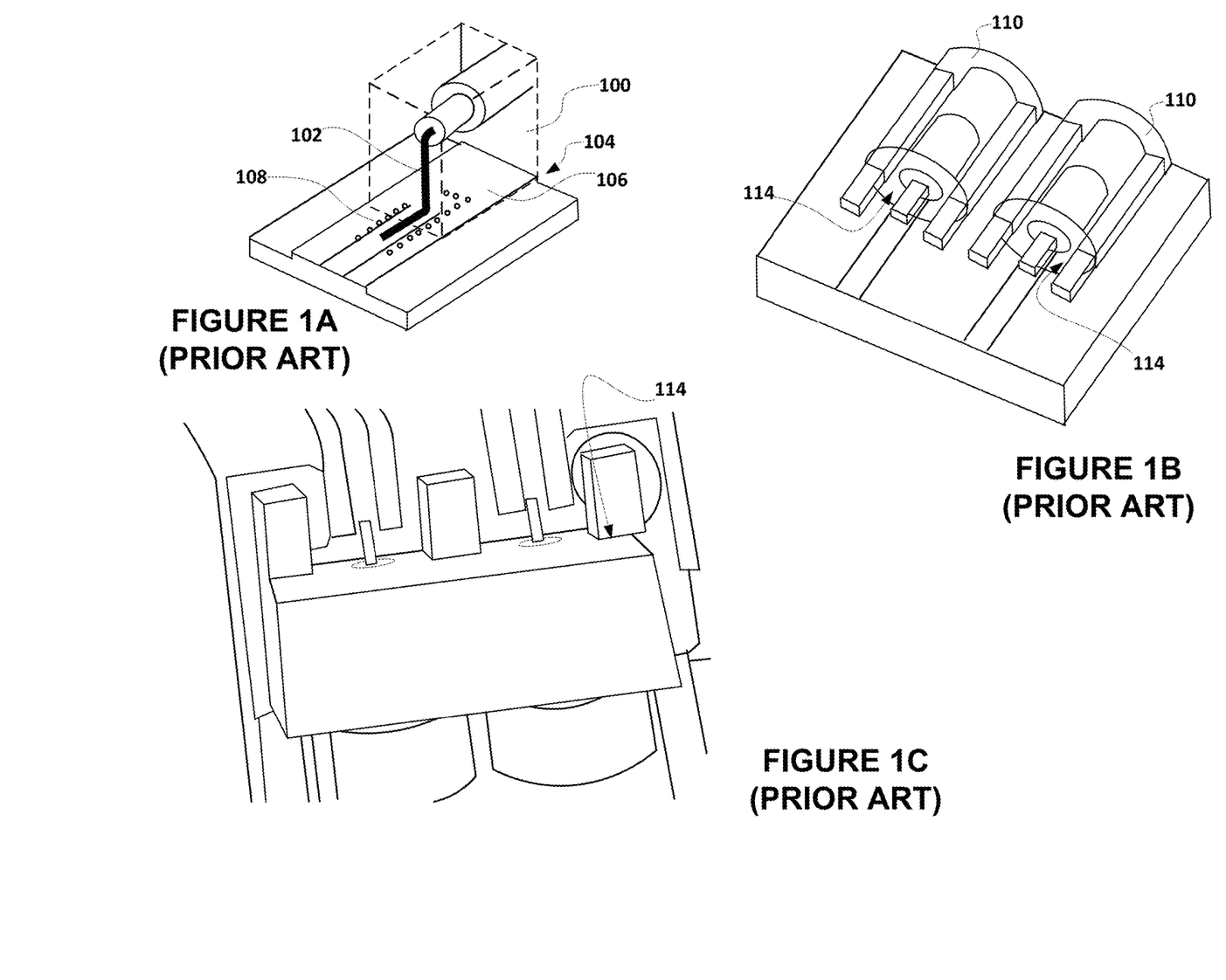
FIG. 1A is a schematic diagram showing a prior art GPPO connector surface mounted to a PCB.
FIG. 1B is another schematic diagram showing prior art GPO connectors edge mounted to a PCB.
FIG. 1C is a schematic diagram showing another prior art GPPO connector edge mounted to a PCB.

For example, within current electro-optical (E-O) interfaces between signal modulators and coherent Digital Signal Processing (DSP) chips, Gilbert's Push-On (GPO) and GPPO connectors are employed either edge-mounted or surface-mounted. FIGS. 1A, 1B and 1C show conventional GPO and GPPO connectors mounted on a PCB board to convey signals between E-O Modulators and Coherent DSP chips. Conventional Printed Circuit Board (PCB) connectivity attempts suffer from disadvantages and defects including susceptibility to different signal resonance modes even in the lower frequency band of 10 GHz~20 GHz.

FIG. 1A illustrates a GPPO connector surface-mounted to a PCB of a signal modulator card. GPPO connector 100, using a bent pin 102, is surface mounted 104 on a PCB pad 106. The bent pin 102 end PCB attachment is surrounded with rectangular array 108 of ground vias. Pin 102 has two bends within connector body 100 for a total of three bends including a bend for the pin 102 leading into a pad of the PCB trace.

FIG. 1B illustrates GPO connectors edge-mounted to a PCB of a signal modulator component card. The PCB needs a rectangle cut-out to fit each connector body 110 on edge. GPO connectors 110 always employ an air gap 114, about 0.5~3 mils wide, between connector body 110 and the PCB cut-out necessary for component assembly.

FIG. 1C illustrates a conventional GPPO connector employing a similar air gap 114 between connector body and PCB cut-out.

The connector to PCB signal trace transition structures illustrated in FIGS. 1A, 1B and 1C have been found to make it very easy to excite different RF signal resonance modes, especially in the millimeter waveband. Such resonance results in large notches/ripples in insertion loss and return loss, and cause system failure due to the resulting faulty transfer function. Such system performance failures incur huge cost due to product re-spin and deployment delays. This is a common issue recognized in the art particularly in manufacturing coherent DSP line cards and E-O modules.

Figure 2A:
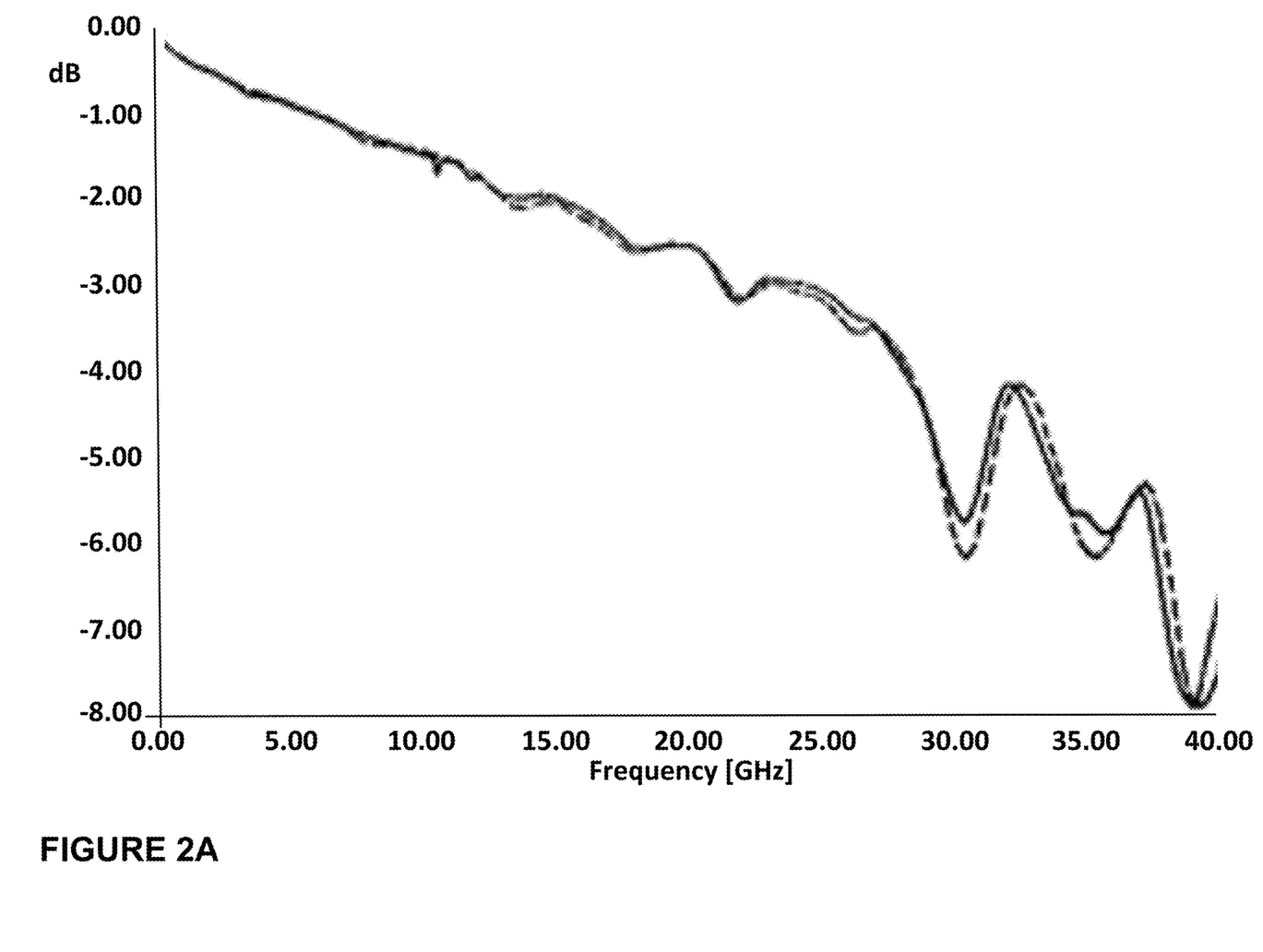
FIG. 2A is schematic graph showing lab measured resonance for the surface mounted GPPO connectors as illustrated in FIG. 1A.

As an example, FIG. 2A illustrates lab measured resonance notches at 30 GHz when using surface mounted GPPO connectors 100 as illustrated in FIG. 1A.

Figure 2B:
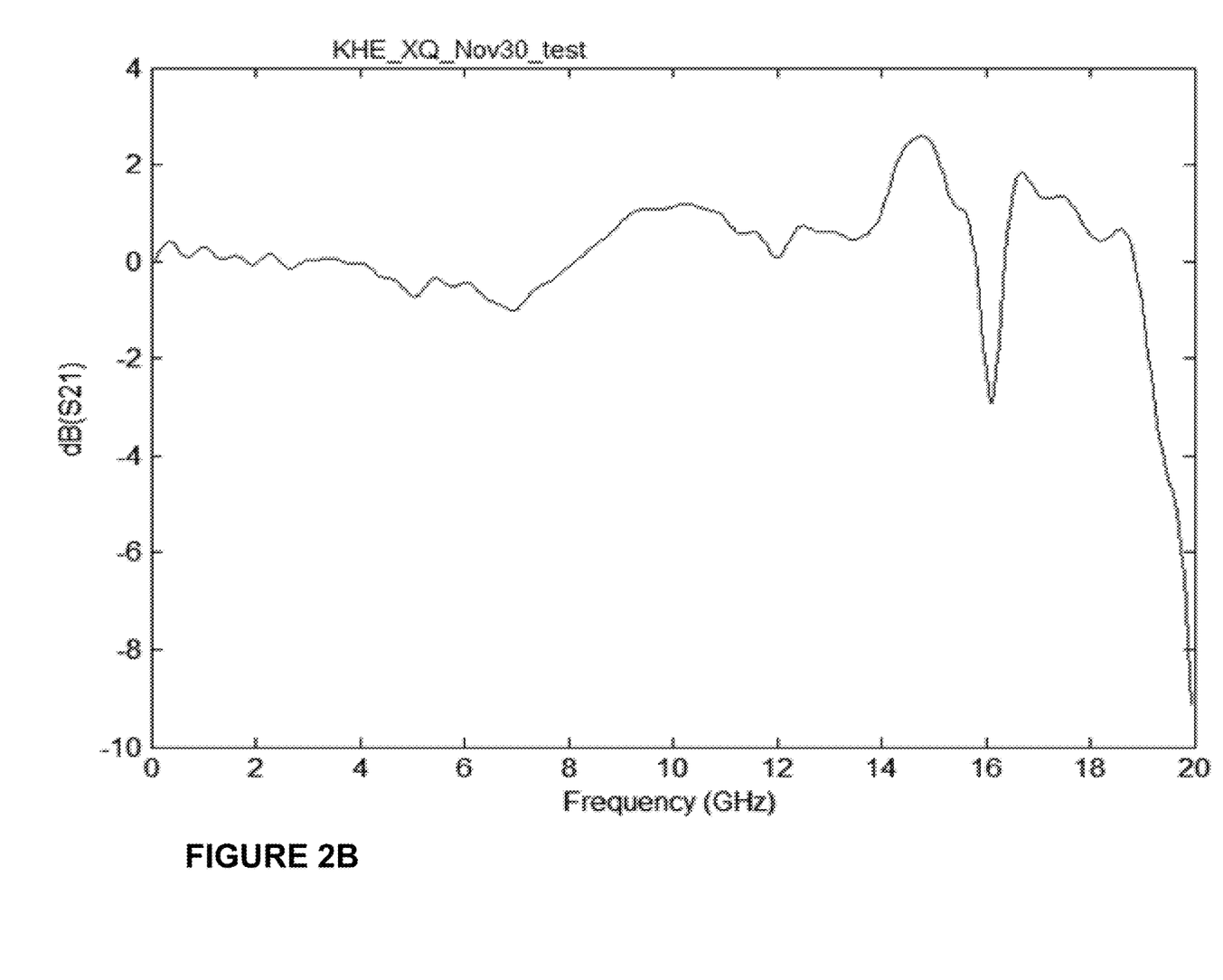
FIG. 2B is a schematic graph showing factory measured resonance for edge mounted DPO connectors as illustrated in FIG. 1B.

FIG. 2B illustrates factory measured resonance notches between 16 GHz 18 GHz when using GPO connectors 110 edge-mounted to a PCB as illustrated in FIG. 1B.

Figure 2C:
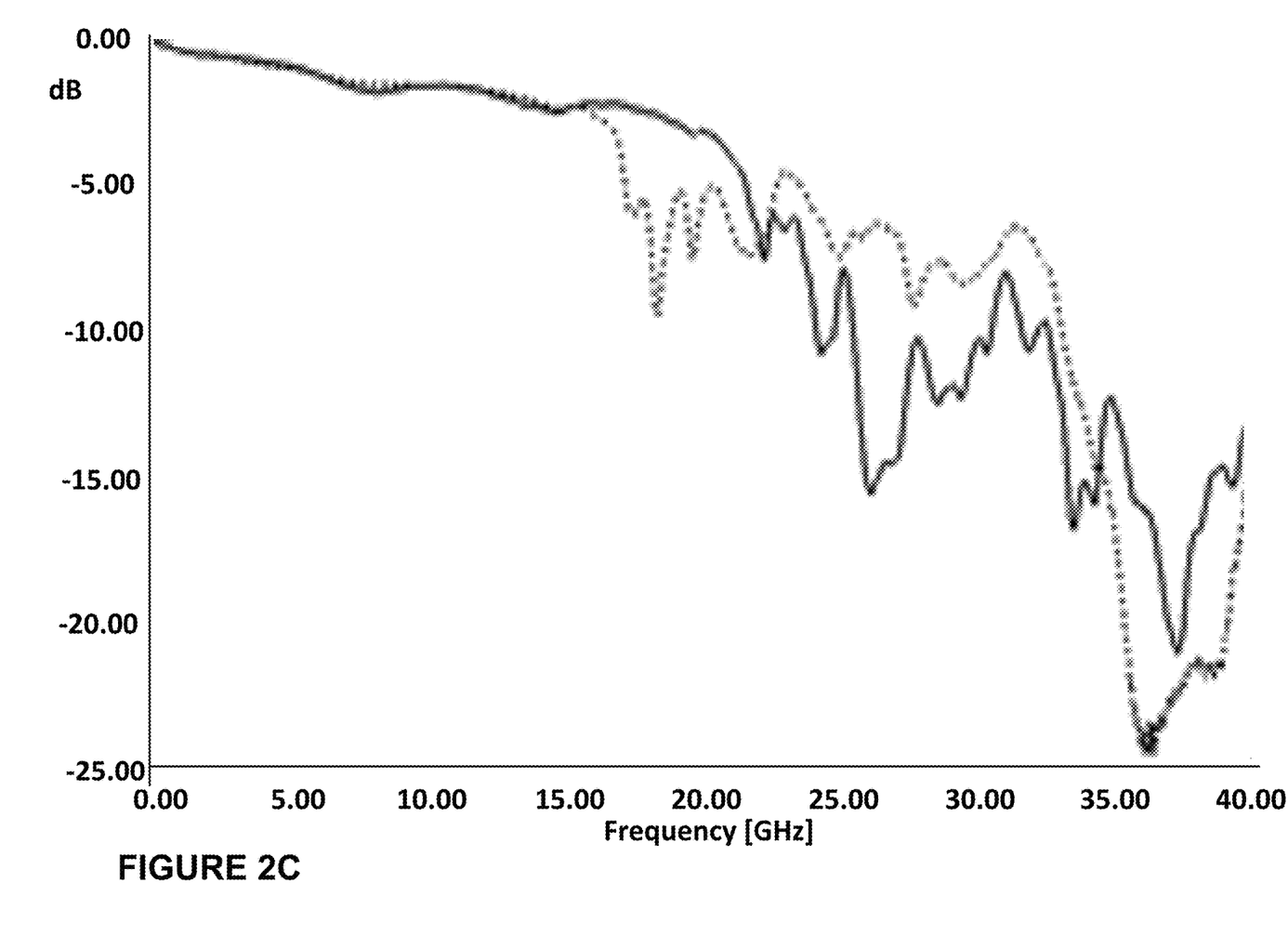
FIG. 2C is a schematic graph showing lab measured resonance for the edge mounted GPPO connector as illustrated in FIG. 1C.

FIG. 2C illustrates measured resonance notches between 16 GHz~20 GHz when using an edge mounted GPPO connector with an air gap.

The above illustrated resonance notches in the transfer function could not be compensated out with current Finite Impulse Response (FIR) and/or passive equalizers within a coherent DSP chip because they are too sharp. Such electrical interfaces between E-O modulator and DSP chips are a "bandwidth bottleneck" for high speed telecommunications. There is a need to improve RF signal coupling into and out of a signal trace of a PCB via a RF connector.

SUMMARY

In general, transmission of RF signals can be provided by RF coaxial cables. A RF coaxial cable has an inner conductor surrounded by a tubular insulating layer, which in turn is surrounded by a tubular conductive shield. An external tubular outer sheath or jacket provides physical protection for the RF cable. RF cables are said to have a transmission line impedance, for example 50Ω.

RF connectors are electrical connectors intended to operate at radio frequencies with reduced change in transmission line impedance. An RF connector may connect a RF coaxial cable or another RF connector to an electronic circuit, for example an electronic circuit on a PCB. The RF connector maintains the RF shielding and transmission line impedance within the RF connector, however as described hereinabove conventional connection of a RF connector to PCB signal trace incurs signal transmission discontinuities, for example signal transfer functions show resonance as illustrated in FIGS. 2A, 2B and 2C.

It has been found that such signal transmission discontinuities result from discontinuities in the "inner conductor" between the RF connector and the PCB signal trace, discontinuities in the "insulation" between the RF connector and the PCB, and discontinuities in the "conductive shielding" between the RF connector and PCB ground.

At least the above issues identified in the prior art, can be alleviated by employing one of WSMP, G3PO and SMPS surface mount RF connector and a PCB signal pad structure to provide RF signal transition from the RF connector to the PCB signal trace and vice versa. WSMP is a trademark of Rosenberger. GPO, GPPO and G3PO are trademarks of Corning Gilbert. SMPS is a trademark of Radiall. Generally the WSMP, G3PO and SMPS connectors provide a push-on connection without a threaded barrel.

In accordance with an aspect of the proposed solution there is provided a PCB having a plurality of dielectric layers distributed between a plurality of conductive layers. The PCB includes a RF signal transition at a RF signal pad comprising: a RF signal transmission trace in a conductive signal layer other than a top and bottom conductive layers; a blind via providing electrical conductivity across at least one dielectric layer between the signal transmission trace and the signal pad; and a ground cage structure within the PCB around the RF signal pad and the RF signal transmission trace, wherein the plurality of conductive layers other than the conductive signal layer and conductive portions of the conductive signal layer not in electrical contact with the RF signal transmission trace have common ground connections.

In accordance with another aspect of the proposed solution there is provided an electrical component including a Printed Circuit Board (PCB) having a Radio Frequency (RF) signal pad, the electrical component comprising: a RF connector having a signal pin oriented perpendicularly to the RF signal pad on the PCB; and the PCB having a plurality of dielectric layers distributed between a plurality of conductive layers, the PCB including a RF signal transition at the RF signal pad including: a RF signal transmission trace in a conductive signal layer other than a top and bottom conductive layers; a blind via providing electrical conductivity across at least one dielectric layer between the signal transmission trace and the signal pad; and a ground cage structure within the PCB around the RF signal pad and the RF signal transmission trace, wherein the plurality of conductive layers other than the conductive signal layer and conductive portions of the conductive signal layer not in electrical contact with the RF signal transmission trace have common ground connections, wherein the RF connector signal pin is connected perpendicularly to the RF signal pad.

In accordance with a further aspect of the proposed solution there is provided a PCB manufacture method comprising: forming a RF signal transmission trace in a conductive signal layer of a first PCB core, wherein conductive portions of the conductive signal layer not in electrical contact with the RF signal transmission trace spaced apart from the RF signal transmission trace to provide constant transmission line impedance along the RF signal transmission trace; forming a first anti-pad in the conductive signal layer around a terminal pad of the RF signal transmission trace; forming a second anti-pad in a conductive layer opposite the conductive signal layer of the first PCB core, the second anti-pad being concentric with the first anti-pad; depositing a first laminate layer on top of the conductive signal layer; depositing a top conductive layer on top of the first laminate layer; forming a third anti-pad in the top conductive layer concentric with the first and second anti-pads; forming a RF signal pad in the top conductive layer concentric with the terminal pad of the RF signal transmission trace; forming a blind via providing electrical connectivity between the RF signal pad and the terminal pad of the RF signal transmission trace; forming a plurality of through vias in the plurality of conductive layers other than the conductive signal layer and in conductive portions of the conductive signal layer not in electrical contact with the RF signal transmission trace; and plating the blind via and the plurality through vias with conductive material, wherein a ground cage structure within the PCB is provided around the RF signal pad and the RF signal transmission trace.

BRIEF DESCRIPTION OF THE DRAWINGS

The proposed solution will be better understood by way of the following detailed description of embodiments of the invention with reference to the appended drawings, in which:

FIG. 11 is yet another plot illustrating Voltage Standing Wave Ratio (VSWR) measured results for the implementation of FIGS. 8, 9 and 10, wherein similar features bear similar labels throughout the drawings. While the sequence described can be of significance, reference to "top", "bottom", "front" and "back" qualifiers in the present specification is made solely with reference to the orientation of the drawings as presented in the application and does not imply any absolute spatial orientation.

DETAILED DESCRIPTION

With the development of coherent technology, the data rate between Coherent DSP DAC outputs and E-O phase modulators is moving towards a higher operating range between 56.8 Gb/s and 75 Gb/s in a single channel. The bandwidth of RF high speed electrical interconnects between Coherent DSP DACs and E-O phase modulators is an important factor which influences overall optical system performance including transfer function, chirp and Optical Signal-To-Noise Ratio (OSNR).

The proposed solution relates to RF signal transitioning from a WSMP/G3PO/SMPS RF connector to a Printed Circuit Board (PCB) E-O module and package where coherent DSP chips are located.

Figure 3A:
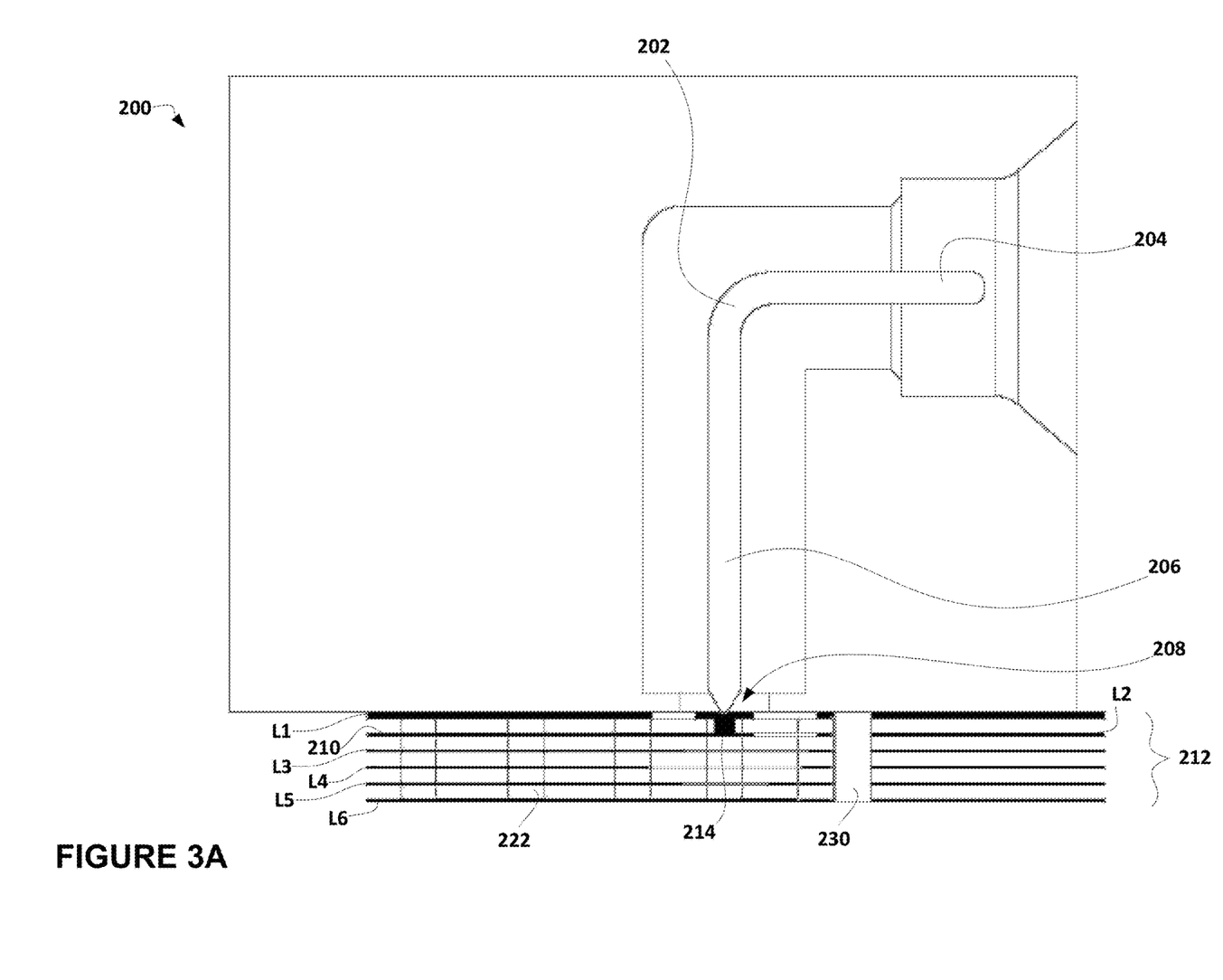
FIG. 3A is a schematic diagram illustrating a plan cross-section view of an RF connector and PCB signal pad structure in accordance with an embodiment of the proposed solution.
Figures 3B, 4A:
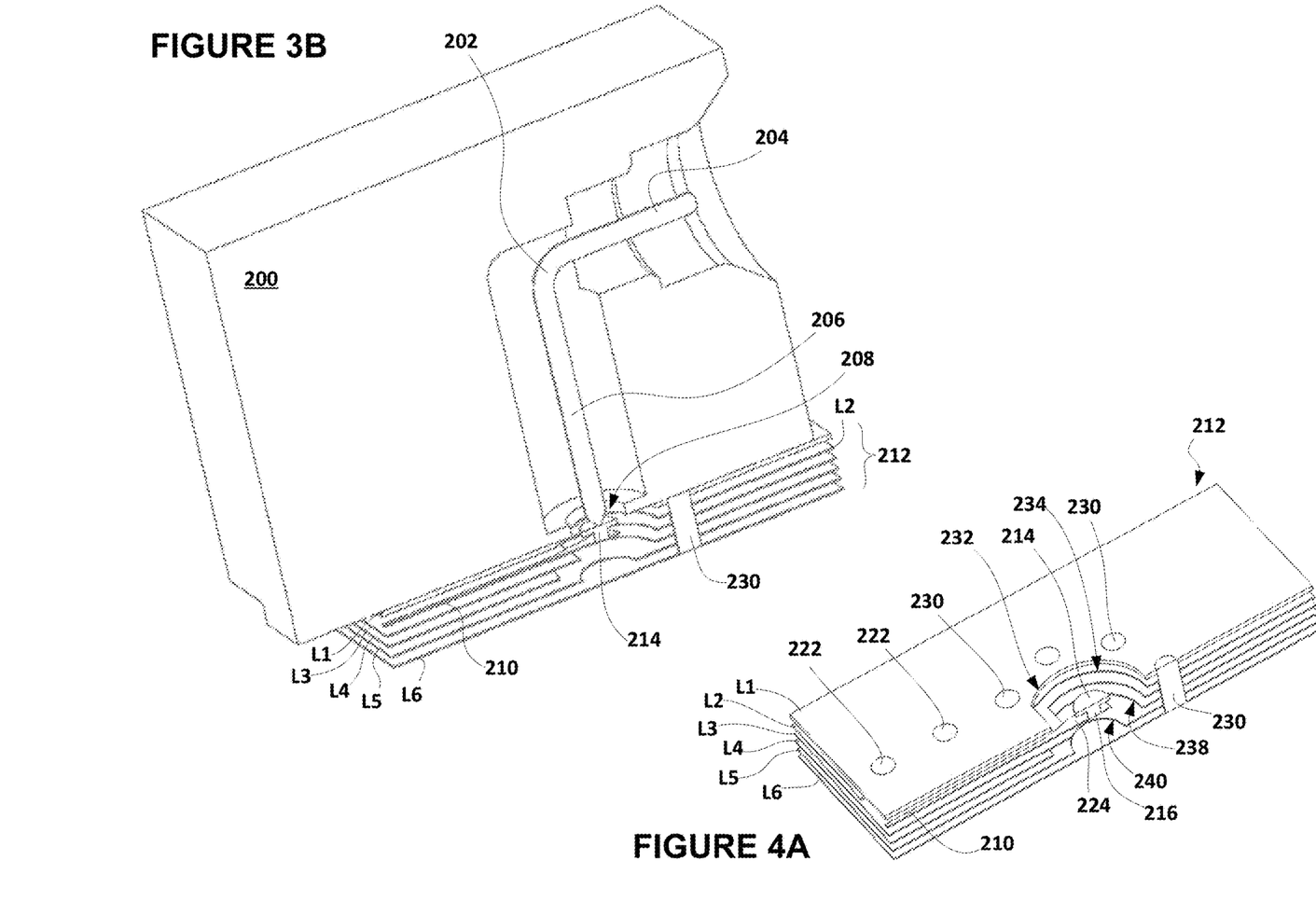
FIG. 3B is a schematic diagram illustrating an isometric cross-section view of the RF connector and PCB signal pad structure of FIG. 3A.
FIG. 4A is a schematic diagram illustrating an isometric partly cutout view of the PCB signal pad structure of FIG. 3B in accordance with the embodiment of the proposed solution.

Such a surface mount WSMP, G3PO and SMPS RF connector 200 is illustrated in cross section in FIG. 3A, and an isometric view of the cross section is illustrated in FIG. 3B. While a two-part RF connector 200 is illustrated, the invention is not limited to two-part WSMP, G3PO and SMPS RF connectors.

With reference to both FIGS. 3A and 3B, in accordance with the proposed solution, the number of bends in the RF signal path, bends which contribute to limit the total signal bandwidth, is reduced to two 90-degree bends. Bend 202 is within the RF connector 200 from horizontal RF pin 204 to vertical pin 206. Another bend 208 is between RF connector vertical pin 206 and the horizontal PCB transmission line 210 of the PCB 212 at the signal pad 214.

For the first bend 202, connector manufacturing parameters are selected for the inner shape(s)/dimensions of the RF connector 200 to obtain near ideal 50 Ohms coaxial impedance at the bend 202. With the second bend 208 in the signal path at connector-PCB transition zone, it is difficult to provide a structure having an inner conductor surrounded by a tubular insulating layer at PCB 212.

In accordance with the proposed solution, a PCB multi-layer configuration is proposed to adjust and/or control the frequency of RF resonance modes out of an increased useful frequency band, to reduce parasitic parameters, and to decrease impedance discontinuity through curve-tuning line/stick shapes, spherical/cone-shaped transition structure and maintaining a coaxial-structure in transition.

In accordance with one embodiment, Table 1 provides a listing of PCB layers (stack-up implementation) in the PCB 212. A person of ordinary skill in the art would recognize that additional layers are not specified such as antioxidation layers (Corrosion Inhibitor) covering exposed copper top and bottom areas typically employed for long term use. Specific details of PCB manufacture are omitted herein. It is understood that in accordance with another implementation the PCB stack up can include three Core layers and two Pre-Impregnated (Pre-Preg.) layers. Other implementations can include another number of copper layers without departing from the proposed solution. For example, certain copper layers include Hyper Low Profile (HVLP) copper foil, Very Low Profile (VLP) copper foil, Reverse-Treatment copper Foil (RTF). It is understood that other laminates can be employed, such as but not limited to Isola 370HR, instead of Pre-Preg. without departing from the proposed solution.

In accordance with the implementation listed in Table 1, the first row in Table 1 specifies an ENIG (Electro-less Nickel Immersion Gold)/ImAg (Immersion Silver) plating employed to provide substantially resistance free area for solder between the RF connector 200 to the PCB board 212 to provide a solid ground return path connection. With respect to conducting layers of the PCB board 212, the first two rows of Table 1 are regarded to specify a single conducting layer 1.88 mils thick. For the remainder of the description herein "L1" will be used to refer to the combination of both top two rows in Table 1.

TABLE 1

| Layer | Dielectric Thick (mils) | Cu Thick (mils) | Layer Type | Material |
|---|---|---|---|---|
| L1 | | 1.5 | Plating, with ENIG or ImAg | |
| L1 | | 0.38 | Foil (GND) | Copper |
| | 4 | | Pre-Impregnated (Pre-Preg.) | Meg 4, Meg 6, Meg 7, Rogers3003, TU933, Park MW4000, Tachyon100G |
| L2 | | 0.6 | HVLP/VLP/RTF (Signal/GND) | Copper |
| | 4 | | Core | Meg 4, Meg 6, Meg 7, Rogers3003, TU933, Park MW4000, Tachyon100G |
| L3 | | 0.6 | HVLP/VLP/RTF (GND) | Copper |
| | 4 | | Pre-Preg. | Meg 4, Meg 6, Meg 7, Rogers3003, TU933, Park MW4000, Tachyon100G |
| L4 | | 0.6 | HVLP/VLP/RTF (GND) | Copper |
| | 4 | | Core | Meg 4, Meg 6, Meg 7, Rogers3003, TU933, Park MW4000, Tachyon100G |
| L5 | | 0.6 | HVLP/VLP/RTF (GND) | Copper |
| | 4 | | Pre-Preg. | Meg 4, Meg 6, Meg 7, Rogers3003, TU933, Park MW4000, Tachyon100G |
| L6 | | 0.6 | HVLP/VLP/RTF (GND) | |

The PCB conductor layer stack-up is illustrated in FIGS. 3A and 3B collectively labeled PCB 212. It is understood that PCB 212 extends further back from the RF connector 200 and extends further sideways (into and out of the page with respect to FIG. 3A) to provide electric connectivity to other electrical components not shown such as but not limited to a Coherent DSP of an E-O module. For ease of illustration of the proposed solution herein, the figures herein do not show the PCB dielectric layers listed in Table 1. However, the type, thickness, material composition and electromagnetic properties of the dielectric layers are important in providing insulation properties between the signal path, and a ground cage around the RF signal path between the pin 206 of the RF connector and the PCB transmission line 210 to provide high speed/low loss operation. Megtron 4, Megtron 6 and Megtron 7 are trademarks of Panasonic. RO3003 (Rogers3003) is a trademark of Rogers Corporation. TU-933 is a trademark of Taiwan Union Technology Corporation. Meteorwave 4000 (Park MW4000) is a trademark of Park Electrochemical. Tachyon 100G is a trademark of Isola Group.

PCB Signal Transmission Trace

In accordance with the example implementation illustrated throughout the figures, L2 has a signal layer type (Signal/GND). Without limiting the invention, a PCB signal transmission trace is lithographically manufactured in the copper layer L2 to route an RF signal along a signal path to/from other components (not shown) on the PCB board. In other implementations, the PCB signal transmission trace can be manufactured in a different copper layer other than the top and bottom copper layers of the PCB 212. At least one upper and lower copper layer with respect to the signal path is used to provide RF shielding below and above along the PCB signal transmission trace 210. In accordance with the illustrated implementation, as best illustrated see-through in FIG. 4B, PCB signal transmission trace 210 strip line is routed out at PCB layer L2 with ground reference planes at layers L1 and L3. Within the same layer L2, 42 mils ground clearance is provided on both sides of the PCB signal transmission trace strip line 210. RF shielding is provided to the sides along the PCB signal transmission trace 210 by grounded portions 220 of the L2 copper layer. High density ground stitching is provided by vias 222 at least through layers L1, L2 and L3 along the PCB signal transmission trace 210. In the figures, without limiting the invention, ground stitching vias 222 are through-vias shown drilled through all layers L1 to L6 of PCB 212, for example 10 mils drill (20 mils diameter pad) and 30 to 75 mils apart. In other implementations blind vias can be employed.

In the transition at layer L2, the PCB signal transmission trace 210 is configured to have a tuned tapered shape 224 expanding to a 22 mils terminal pad to provide an impedance matched transition at high frequency (detail in FIGS. 4B and 5A) to a signal pad 214. While in the figures the dielectric layers are omitted to provide see-through illustration of the proposed solution, the tuned taper 224 lies on a dielectric layer (i.e. not floating).

PCB Signal Pad

SMT pad 214 is provided at layer L1 for center signal vertical conductor pin 206 of the RF connector 200 to be soldered thereto. For example, the connector pin 206 is soldered during oven re-flow to SMT pad 214 on the PCB 212. For example, the SMT pad 214 has a 16 mils diameter at PCB top layer L1. This transition transfers the signal path to PCB signal transmission trace strip line 210 on PCB layer L2.

Figures 4B, 4C:
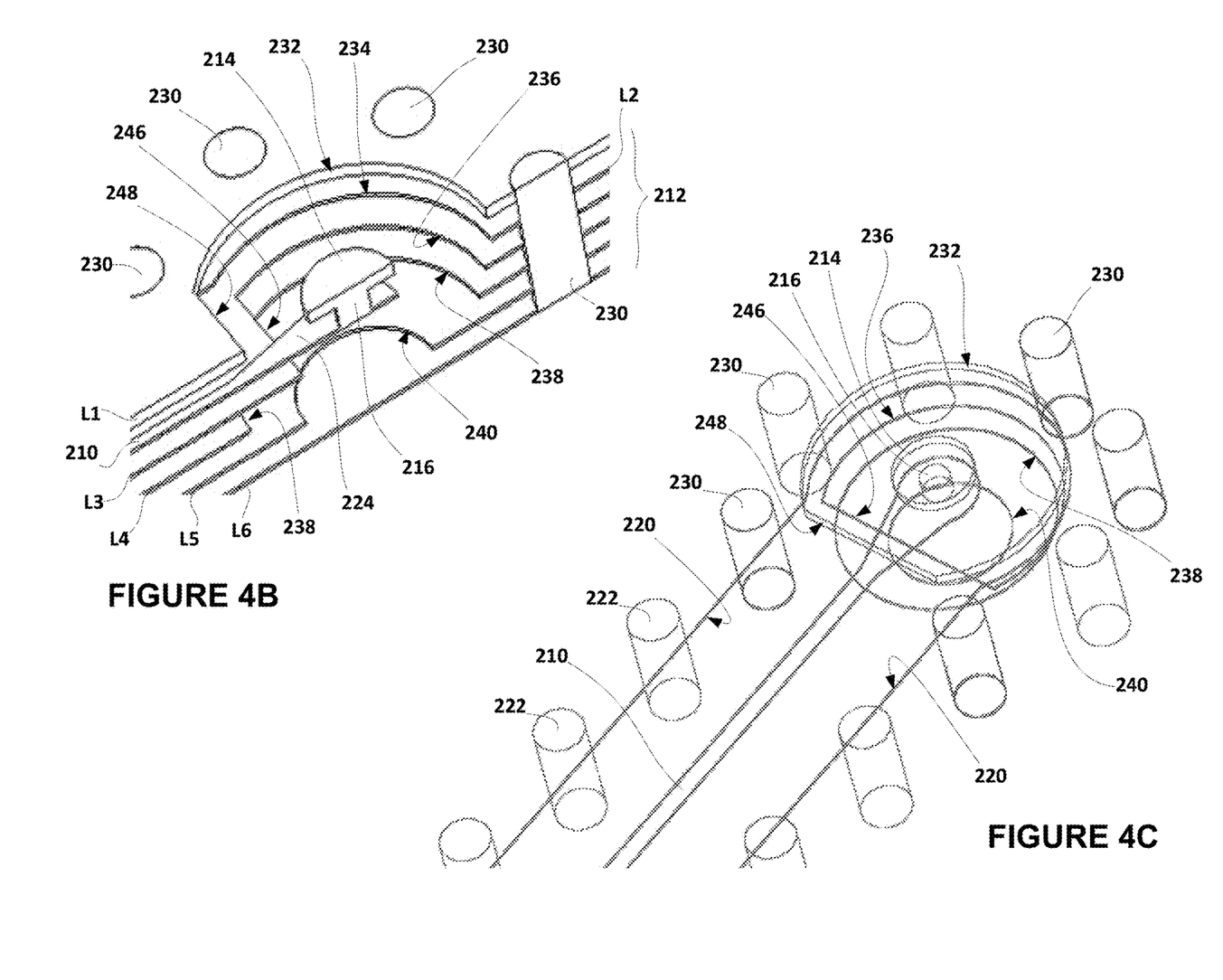
FIG. 4B is a schematic diagram illustrating an enlarged isometric partly cutout view of the PCB signal pad structure of FIG. 4A.
FIG. 4C is a schematic diagram illustrating an isometric see through view of the PCB signal pad and PCB signal trace corresponding to the cutout views of FIGS. 3B, 4A and 4B.
Figure 5A:
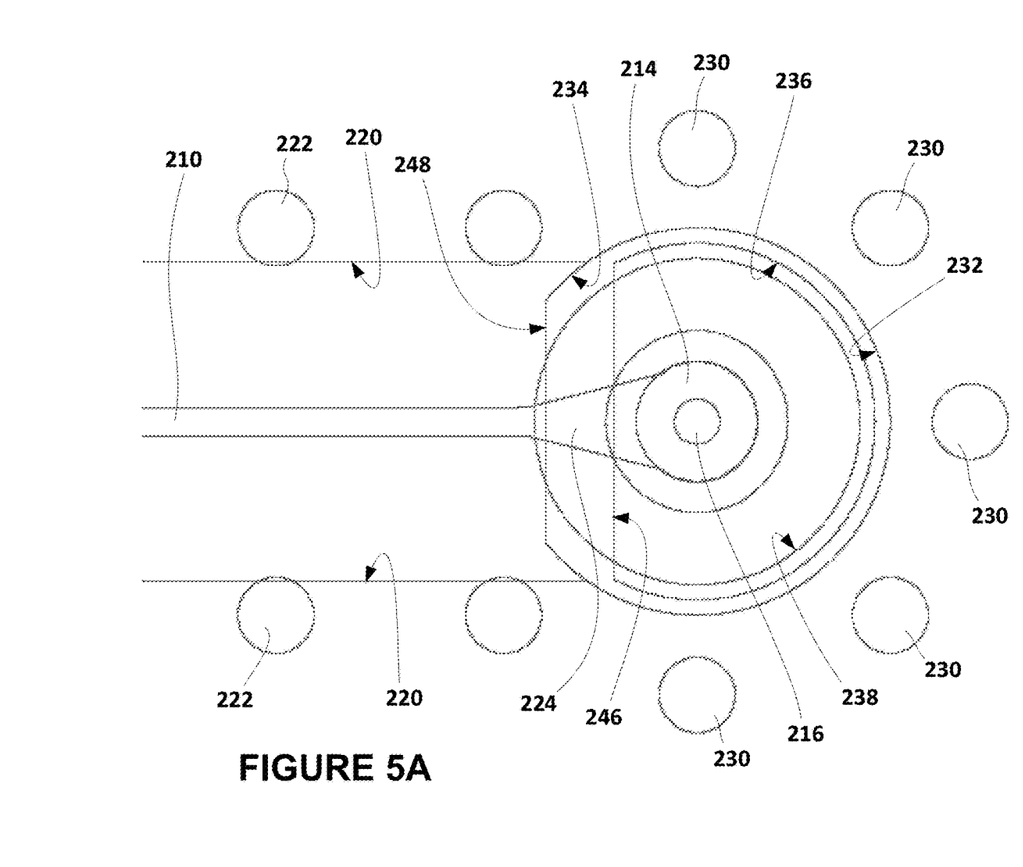
FIG. 5A is a schematic diagram illustrating a top see through view of the PCB signal pad and PCB signal trace corresponding to FIG. 4B.
Figure 5B:
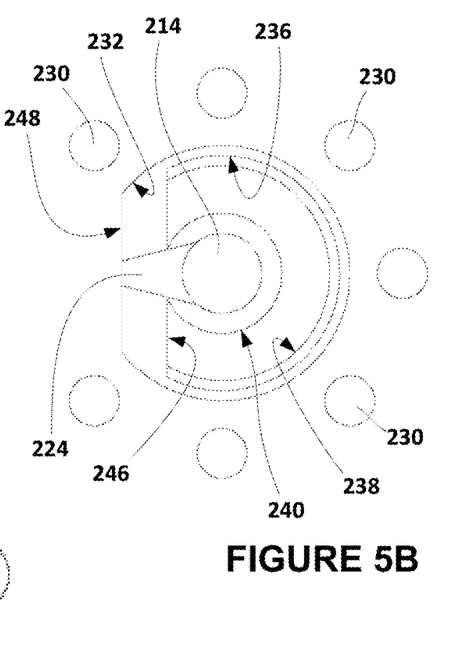
FIG. 5B is a schematic diagram illustrating a top plan view of the PCB signal pad corresponding to FIG. 5A.

During PCB layer manufacturing, a blind-via 216, best illustrated in FIGS. 4A and 4B, is laser drilled in the top copper layer and top dielectric layer to the terminal pad of the PCB signal transmission trace 210. For example, the drilled via diameter dimension is 6 mils. After plating the blind-via 216, the blind-via 216 can be filled with conductive paste such as CB-100 or non-conductive epoxy ink. The SMT pad 214 provided during L1 finishing (ENIG/ImAg) is plated with zero stub. While the dielectric layers are omitted to provide see-through illustration of the proposed solution, the 16 mills diameter SMT pad 214 rests on the top of a dielectric layer (i.e. not floating).

PCB Ground Cage Structure

In accordance with the proposed solution, the PCB copper layers at a signal pad on a PCB are contoured during PCB manufacture, for example through PCB lithography, to provide a ground cage around the PCB signal pad and PCB signal transmission trace. With reference to Table 1, layers L1 through L6 have a ground layer type (GND) away from and around the PCB signal transmission trace 210.

Around the SMT pad 214 (and blind via 216) the multiple ground layers of the PCB 212 are contoured in the plane of each corresponding copper layer with selected "anti-pad" diameters for different ground layers. With reference to the inset to FIG. 4B collectively the inner edges of the contoured copper layers can form a spherical-shaped ground structure providing impedance matching in the transition. Without limiting the invention, such a spherical-shaped ground cage structure can be provided by circular ground layer contouring, for example for the six layers listed in Table 1 having: 51 mils anti-pad diameter 232 at layer L1, 51 mils anti-pad diameter 234 at layer L2, 47 mils anti-pad diameter 236 at layer L3, 43 mils anti-pad diameter 238 at layer L4, 24 mils anti-pad diameter 240 at layer L5, and a solid ground plane at layer L6. In accordance with another implementation, the ground cage structure within the PCB around the SMT pad 214 is conical.

Ground through vias 230 are drilled around the SMT pad 214 (FIGS. 4A, 4B and 4C). For example, seven vias 230 of 10 mils diameter drill (20 mils diameter pad) are located evenly around the central pad 214 at a 36 mils radius. This provides a PCB ground cage having a coaxial shape of having about 50 Ohms impedance for cylindrical signal propagation.

Impedance Matching and Signal Discontinuity Control

It has been discovered that an impedance discontinuity from the transition of the RF signal at PCB ground cage close to SMT pad 214 into the PCT signal transmission trace strip line 210 can be compensated by PCB ground layer contouring.

In accordance with the proposed solution, ground reference planes are extended at layers neighboring the PCB transmission trace strip line 210. In accordance with the illustrated implementation, ground reference planes at layers L1 and L3 are extended into the volume of the PCB ground cage structure. For example, FIGS. 4A, 4B, 5A and 5B illustrate ground plane extension along the direction of the PCB transmission trace strip line 210 as perpendicular edge 246 10 mils away from SMT pad 214 at layer L3 and perpendicular edge 248 20 mils away from SMT pad 214 at layer L1. Other layers can be similarly extended to tune impedance in the transition.

Figure 6A:
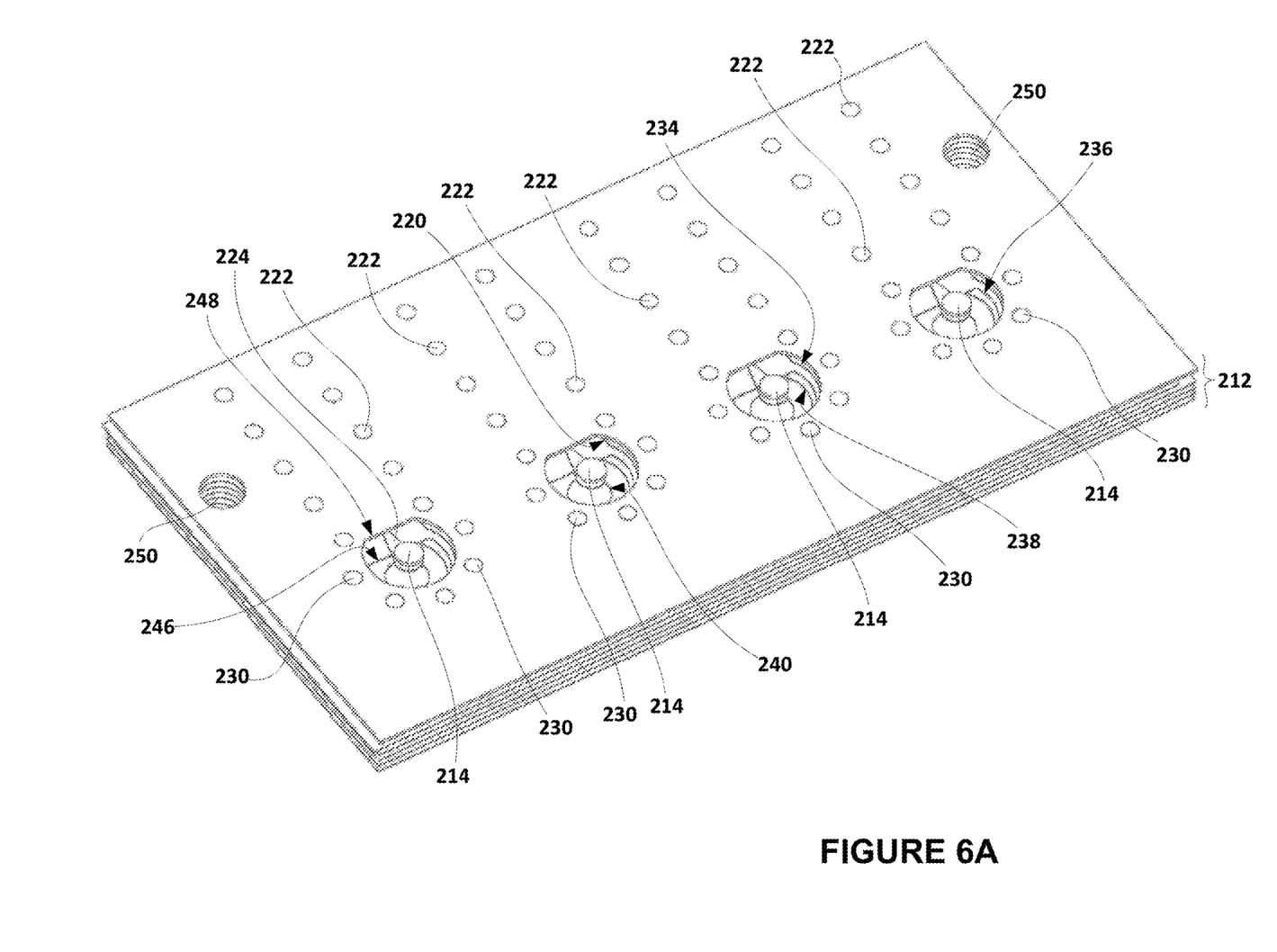
FIG. 6A is a schematic diagram illustrating an isometric view of PCB RF signal transition structure providing four RF signal channels for soldering a quad WSMP/G3PO/SMPS RF connector thereon.
Figure 6B:
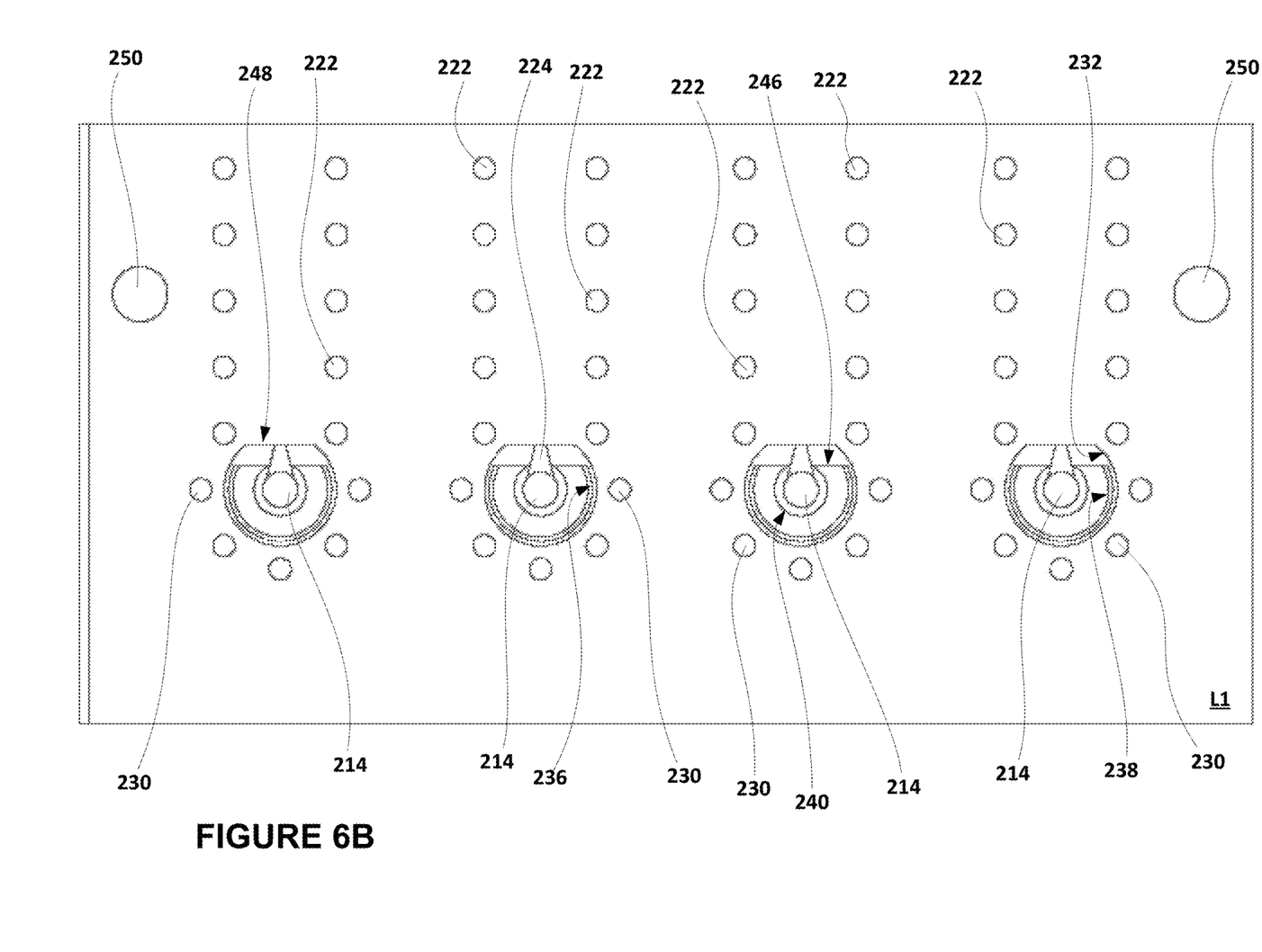
FIG. 6B is a schematic diagram illustrating a top view of the PCB RF signal transition structure of FIG. 6A.

FIGS. 6A and 6B illustrate the proposed solution employed to provide a RF signal transition from a quad WSMP/G3PO/SMPS connector (not shown) to four PCB signal transmission traces of a coherent E-O module. The illustrated extent of the top layer L1 corresponds to the ENIG or ImAg plated area under the WSMP/G3PO/SMPS connector. It is understood that the PCB 212 extends further to the sides and towards the back. Through holes 250 are employed to position the WSMP/G3PO/SMPS connector to register vertical pins 206 with SMT pads 214.

Method of PCB Manufacture

Figure 7:
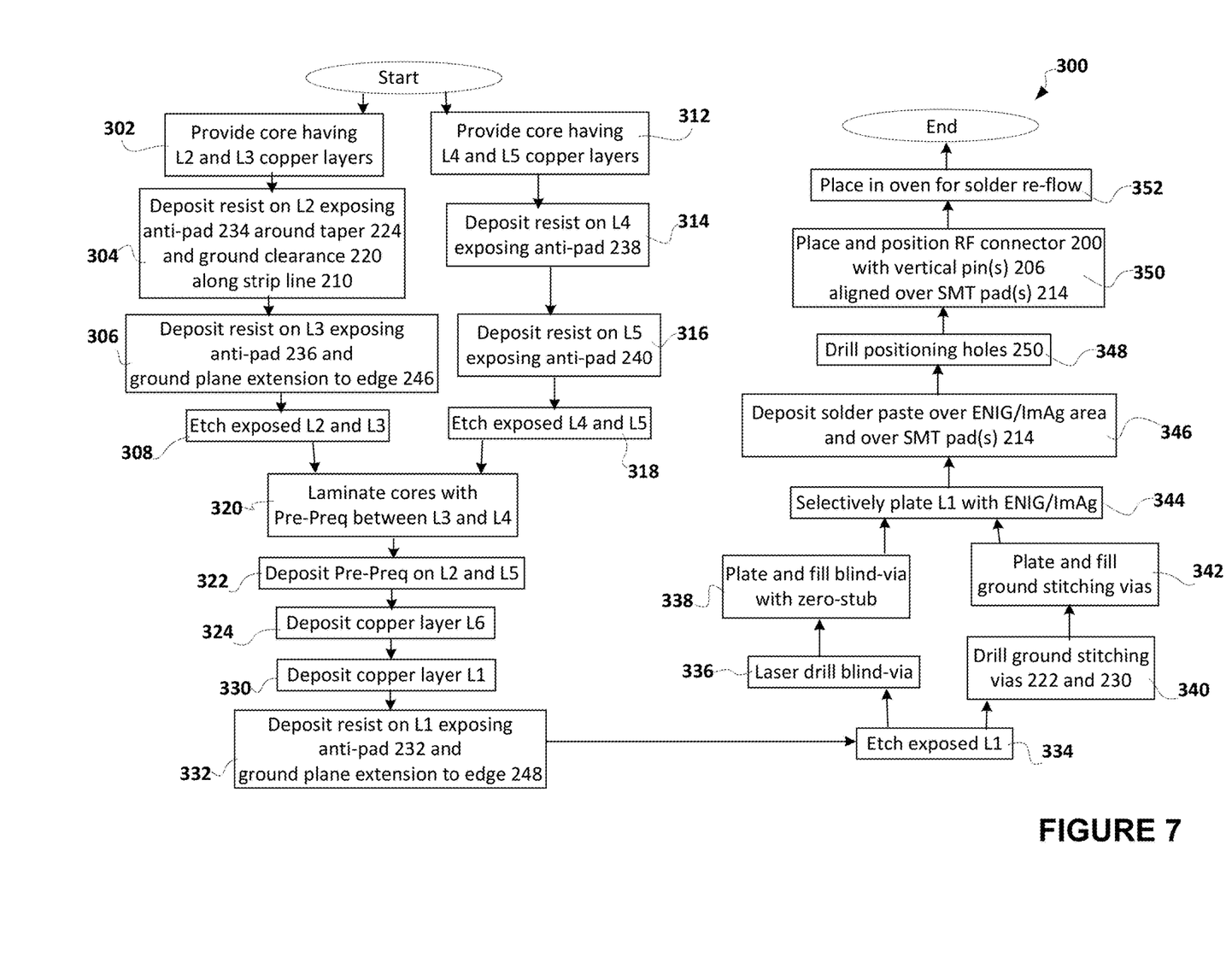
FIG. 7 is a schematic diagram illustrating a PCB manufacturing method in accordance with an implementation of the proposed solution.

With reference to FIG. 7 and Table 1, in accordance with a preferred embodiment of the proposed solution, a method of PCB manufacture 300 includes the following steps some of which are understood by a person of skill in the art to be performed in parallel. Methods of PCB manufacture are understood to relate to PCB fabrication. While the methods of PCB manufacture are described herein with reference to depositing resist, it is understood that the methods can alternatively include laser direct imaging techniques.

A PCB core having copper layers L2 and L3 is provided 302. Lithographic techniques are employed to deposit 304 a resist over layer L2 exposing the anti-pad 234 away from the taper 224 and exposing the ground clearance 220 along the PCB signal transmission trace 210. Resist is also deposited 306 over layer L3 exposing the copper between anti-pad 236 and ground plane extension to edge 246. Exposed copper in layers L2 and L3 is etched 308 away.

A PCB core having copper layers L4 and L5 is provided 312. Lithographic techniques are employed to deposit 314 a resist over layer L4 exposing the anti-pad 238. Resist is also deposited 316 over layer L5 exposing the anti-pad 240. Exposed copper in layers L4 and L5 is etched 318 away.

The two PCB cores are laminated 320 using Pre-Preg. between layers L3 and L4. Pre-Preg. is deposited 322 on layers L2 and L5. Copper layer L6 is deposited 324.

Copper layer L1 is deposited 330. Resist is deposited 332 over layer L1 exposing the copper between pad 214, anti-pad 232 and ground plane extension to edge 248. Exposed copper in layer L1 is etched 334 away. Blind-via 216 is laser drilled 336 exposing L2. Blind-via 216 is plated and filled 338 with one of conductive paste such as CB-100 with zero stub (planarized). Alternatively, the blind-via 216 can be filled with non-conductive epoxy ink.

Ground stitching vias 222 and 230 are drilled 340 and plated/filled 342. The ground stitching vias 222 and 230 can be filled with one of conductive paste and non-conductive epoxy ink. Layer L1 is selectively plated 344 with ENIG or ImAg. Solder paste is deposited 346 over the ENIG/ImAg exposed area and SMT pads 214. Positioning holes 250 are drilled 348.

An WSMP/G3PO/SMPS connector 200 is positioned 350 on top with vertical pins 206 registered over SMT pads 214. The PCB 212 and RF connector 200 are placed in an oven for solder re-flow 252.

The preferred PCB manufacture method has been found improve production yield.

In accordance with another method, the above PCB manufacture steps can be re-sequenced to employ three PCB cores laminated with two layers of Pre-Preg.

Characterization Measurements

Figure 8:
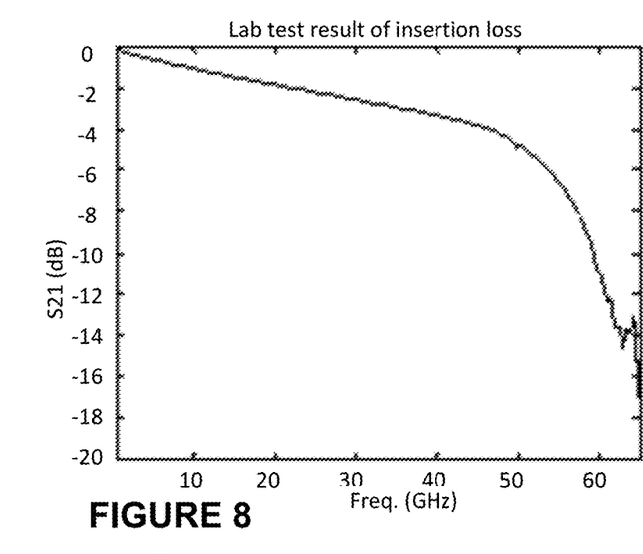
FIG. 8 is a plot illustrating insertion loss measured results for an implementation in accordance with the proposed solution.
Figure 9:
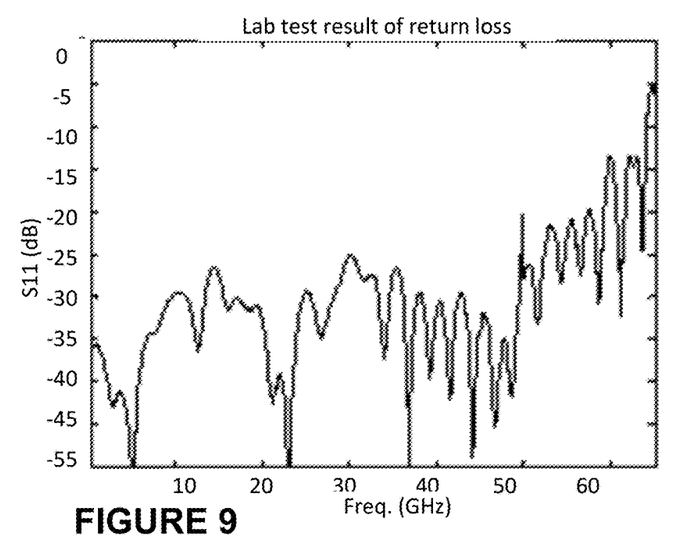
FIG. 9 is another plot illustrating return loss measured results for the implementation of FIG. 8.
Figure 10:
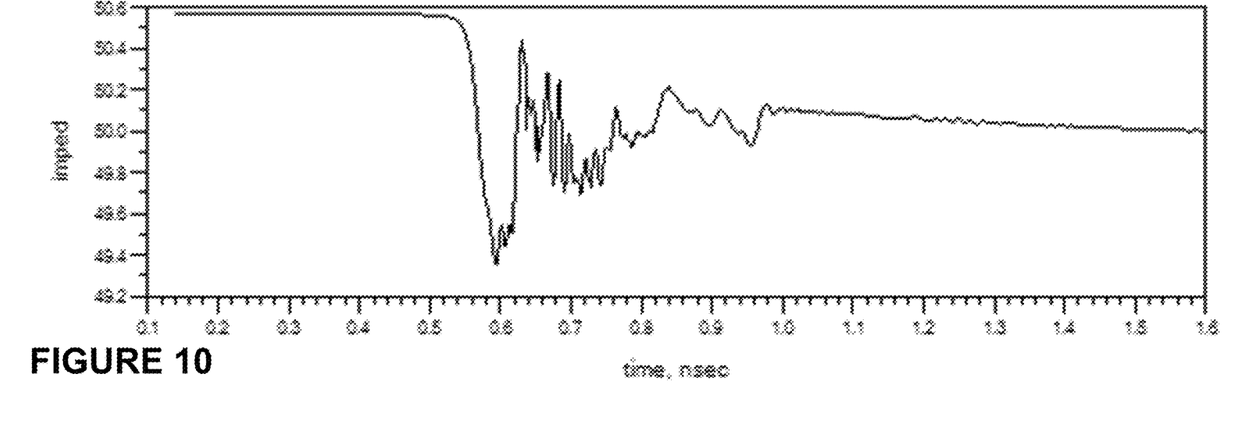
FIG. 10 is a further plot illustrating Time Domain Reflectometry (TDR) impedance measured results for the implementation of FIGS. 8 and 9.
Figure 11:
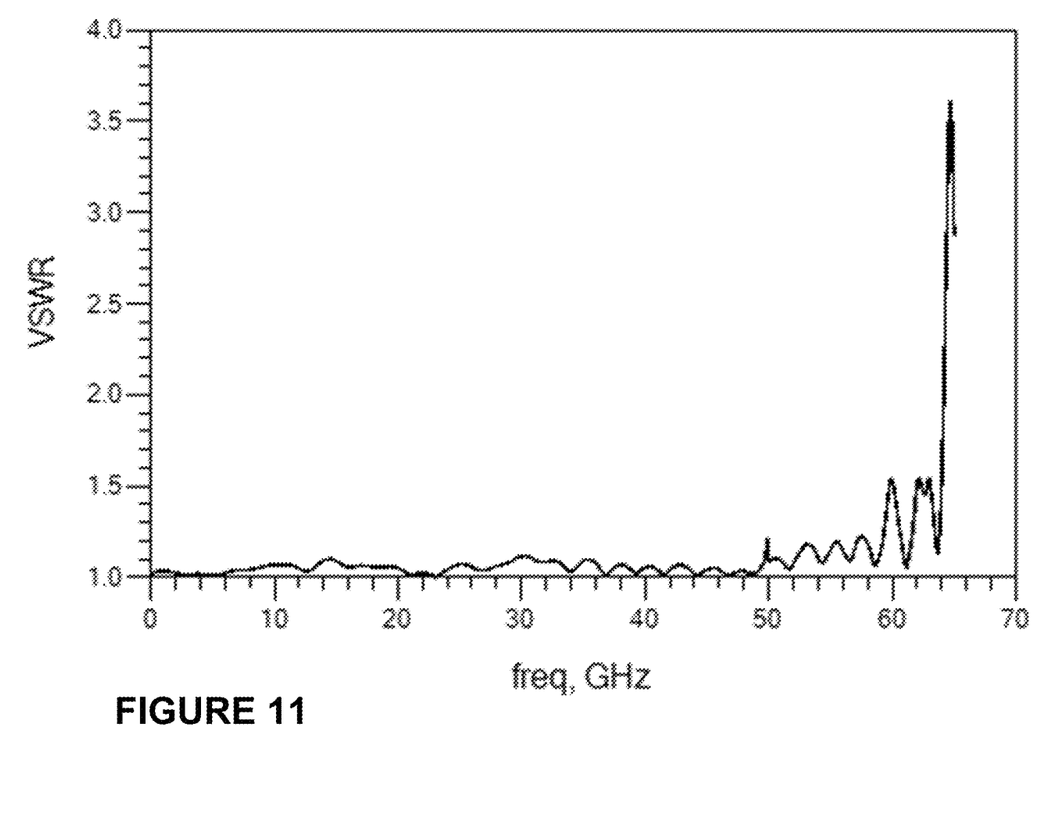

The combination of elements and techniques of the proposed solution has been tested. Based on measurements, the transition design is resonance-free up to 60 GHz as illustrated in FIG. 8. FIG. 9 illustrates return loss better than −20 dB up to 57 GHz. FIG. 10 illustrates a measured Time Domain Reflectometry (TDR) impedance between 49.7 Ohms~50.1 Ohms. TDR measures reflections that result from a signal travelling through the PCB RF signal transmission trace 210 and connector 200. FIG. 11 illustrates measured Voltage Standing Wave Ratio (VSWR) less than 1.18 up to 53 GHz. VSWR is a measure of the efficiency of radio-frequency power transmission from a power source through a transmission line into a load (for example, from a power amplifier through a transmission line). These measurements have been found to agree with simulation results.

The proposed solution provides good broadband of operation for improved data transmission of Non-Return-to-Zero (NRZ)/Return-to-Zero (RZ)/Four-level Pulse Amplitude Modulation (PAM4) signals at rates up to 100 Gbps (50 GHz for first Nyquist frequency spectrum). When the proposed solution is used in an optical coherent solution, improved optical performance is provided with transmitter path flatness without notch up to 60 GHz, <20 dB return loss up to 57 GHz.

While the invention has been illustrated and described with reference to preferred embodiments thereof, it will be recognized by those skilled in the art that various changes in form and detail may be made therein without departing from the spirit and scope of the invention as defined by the appended claims.

What is claimed is:

1. A Printed Circuit Board (PCB) comprising:
a plurality of layers;
a signal pad, at one of the plurality of layers, connected to a signal transmission trace, wherein the signal pad is directly connected to a surface mount Radio Frequency (RF) connector that interfaces an RF signal with the signal pad; and
a plurality of vias surrounding the signal pad such that the plurality of vias forms a PCB ground cage structure disposed through the plurality of layers, wherein the PCB ground cage structure through the plurality of layers includes each of the plurality of layers having a contour around the signal pad with at least two of the plurality of layers having different diameters for their associated contours.

2. The PCB of claim 1, wherein the PCB ground cage structure includes a coaxial shape through the plurality of layers.

3. The PCB of claim 1, wherein the PCB ground cage structure includes a ground reference plane at one or more of the plurality of layers.

4. The PCB of claim 3, wherein the ground reference plane is extended, into the PCB ground cage structure, at layers neighboring the signal transmission trace.

5. The PCB of claim 1, wherein the Radio Frequency (RF) signal is up to 50 GHz.

6. The PCB of claim 1, wherein a signal path between the surface mount RF connector to the signal pad has two 90-degree bends.

7. The PCB of claim 1, wherein the plurality of layers about the signal pad are shaped in a transition structure for impedance matching.

8. The PCB of claim 1, wherein the surface mount RF connector is one of a WSMP, G3PO and SMPS surface mount RF connector.

9. The PCB of claim 1, wherein the signal transmission trace includes a tapered shape as it connects to the signal pad.

10. The PCB of claim 1, wherein the signal transmission trace is soldered to the signal pad.

11. A Printed Circuit Board (PCB) comprising:
a plurality of layers;
a signal pad, at one of the plurality of layers, connected to a signal transmission trace, wherein the signal pad is directly connected to a surface mount Radio Frequency (RF) connector that interfaces an RF signal with the signal pad;
a ground reference plane at one or more of the plurality of layers;
a plurality of vias surrounding the signal pad and each positioned around the signal pad such that the plurality of vias forms a PCB ground cage structure disposed through the plurality of layers, wherein the PCB ground cage structure through the plurality of layers includes each of the plurality of layers having a contour around the signal pad with at least two of the plurality of layers having different diameters for their associated contours.

12. The PCB of claim 11, wherein the PCB ground cage structure includes a coaxial shape through the plurality of layers.

13. The PCB of claim 11, wherein the ground reference plane is extended, into the PCB ground cage structure, at layers neighboring the signal transmission trace.

14. The PCB of claim 11, wherein the Radio Frequency (RF) signal is up to 50 GHz.

15. The PCB of claim 11, wherein a signal path between the surface mount RF connector to the signal pad has two 90-degree bends.

16. The PCB of claim 11, wherein the plurality of layers about the signal pad are shaped in a transition structure for impedance matching.

17. The PCB of claim 11, wherein the surface mount RF connector is one of a WSMP, G3PO and SMPS surface mount RF connector.

18. The PCB of claim 11, wherein the signal transmission trace includes a tapered shape as it connects to the signal pad.

19. The PCB of claim 11, wherein the signal transmission trace is soldered to the signal pad.

* * * * *